(12) United States Patent
Conger et al.

(10) Patent No.: US 8,857,045 B2
(45) Date of Patent: Oct. 14, 2014

(54) METHOD OF ASSEMBLING A CIRCUIT BOARD ASSEMBLY

(75) Inventors: Ryan Adam Conger, Greenville, SC (US); Robert Ivan Rose, Gardnerville, NV (US); Dale Stewart Apgar, Gardnerville, NV (US); Robert Paul Stachow, Jr., Carson City, NV (US)

(73) Assignee: General Electric Company, Schenectady, NY (US)

( * ) Notice: Subject to any disclaimer, the term of this patent is extended or adjusted under 35 U.S.C. 154(b) by 803 days.

(21) Appl. No.: 13/151,871

(22) Filed: Jun. 2, 2011

(65) Prior Publication Data

US 2011/0232084 A1 Sep. 29, 2011

Related U.S. Application Data

(62) Division of application No. 12/565,537, filed on Sep. 23, 2009, now Pat. No. 7,975,369.

(51) Int. Cl.
*B23P 19/00* (2006.01)
*H05K 1/14* (2006.01)
*H05K 3/00* (2006.01)

(52) U.S. Cl.
CPC .......... *H05K 1/148* (2013.01); *H05K 2201/056* (2013.01); *H05K 2203/167* (2013.01); *H05K 3/0064* (2013.01)
USPC .................... 29/729; 29/759; 29/760; 29/832

(58) Field of Classification Search
CPC ................ H05K 1/148; H05K 3/0064; H05K 2201/056; H05K 2203/167
USPC .......... 29/729, 739, 759–760, 830–831, 825; 324/761, 158.1, 754–755
See application file for complete search history.

(56) References Cited

U.S. PATENT DOCUMENTS

| | | | |
|---|---|---|---|
| 4,151,945 A | 5/1979 | Ragard et al. | |
| 5,759,269 A | 6/1998 | Cutting et al. | |
| 5,831,828 A | 11/1998 | Cutting et al. | |
| 5,969,945 A | 10/1999 | Cutting et al. | |
| 7,518,356 B2 * | 4/2009 | Hopkins et al. | 324/750.16 |
| 7,733,659 B2 * | 6/2010 | Snider et al. | 361/752 |
| 7,975,369 B2 * | 7/2011 | Conger et al. | 29/729 |
| 2008/0143379 A1 | 6/2008 | Norman | |

* cited by examiner

*Primary Examiner* — Minh Trinh
(74) *Attorney, Agent, or Firm* — Armstrong Teasdale LLP

(57) ABSTRACT

A method of assembling a circuit board assembly is provided. The circuit board assembly includes a circuit board assembly fixture and a plurality of fixed circuits. The method includes coupling the plurality of fixed circuits to the circuit board assembly fixture. The plurality of fixed circuits includes at least one of a fully flexible circuit, a flexible circuit having stiffeners, and a rigid circuit. The fixture includes a plurality of supporting surfaces each including a first side, configured to receive at least one of the fixed circuits, and an opposite second side. The fixture includes at least one hinge, at least one fastening mechanism extending from the first side, and at least one retainer coupled to at least one of the plurality of supporting surfaces. The method includes folding the circuit board assembly fixture into a desired alignment.

8 Claims, 3 Drawing Sheets

METHOD OF ASSEMBLING A CIRCUIT BOARD ASSEMBLY

CROSS-REFERENCE TO RELATED APPLICATIONS

This application is a divisional of U.S. patent application Ser. No. 12/565,537, filed Sep. 23, 2009, now issued as U.S. Pat. No. 7,975,369, which is hereby incorporated by reference and is assigned to the assignee of the present invention.

BACKGROUND OF THE INVENTION

The embodiments described herein relates generally to circuit boards, and more particularly, to a method and apparatus for assembly of circuit boards that include at least one flexible circuit.

Known circuit boards are generally manufactured on a rigid substrate. Components coupled to the circuit boards are often electrically connected to the board via solder, wire wrapping, or detachable cables, all of which can be subjected to failure points and may be expensive to manufacture. Hybrid rigid flexible circuit boards, also known as rigid-flex circuits, are printed circuit boards (PCB) that include at least one flexible conductive circuit portion that couples two or more rigid circuit boards. Generally, such flexible conductive circuit portions extend from an edge of a rigid circuit portion of one circuit board to the edge of an adjacent circuit board and thus acts as a flexible extension of what normally would be fabricated on or within one of the layers of the rigid circuit portion. Alternatively, a circuit board may include only flexible circuits that may use stiffeners to form what would normally be a rigid circuit board. By using both flexible and semi-rigid or rigid circuit portions, a larger circuit board can be partitioned into smaller circuit boards that are connected together using flexible circuits. Such a design may be necessary to satisfy design requirements, and/or space limitations.

Some known methods of assembling a circuit board, that includes a flexible circuit, require bending the flexible circuit portions to enable the circuit boards to conform to a specific shape. More specifically, depending on the integrity of the board, and the amount of bending necessary, during some known assembly methods, the flexible circuit portions are bent to a desired shape and the circuit board portions are coupled to a jig to form the final needed shape. The boards are then secured in that shape, using fasteners for example, and the final shaped assembly is detached from the jig, which can then be re-used for the next circuit board assembly. After the circuit board is assembled into the desired shape, another jig or device can be used to align the board for installation into a housing.

The above known methods of assembling a circuit board can create inoperable assemblies if the flexible circuit portion is bent with a tight radius thus pinching or breaking the flexible circuit portion. Moreover, such methods of assembly may incorporate assembly steps that can induce undesirable stresses on the circuit board assembly. Further, such methods of assembly may increase the risk and likelihood of misalignment in final assembly.

BRIEF DESCRIPTION OF THE INVENTION

In one aspect, a circuit board assembly fixture for use in assembling a circuit board assembly. The fixture includes a plurality of supporting surfaces each including a first side and an opposite second side, wherein each first side is configured to receive at least one of a plurality of fixed circuits to be coupled together using at least one flexible circuit, and the plurality of fixed circuits includes at least one of a fully flexible circuit, a flexible circuit having stiffeners, and a rigid circuit. The fixture also includes at least one hinge configured to couple the plurality of supporting surfaces together, wherein each of the at least one hinge enables the plurality of supporting surfaces to be folded into a desired alignment relative to each other and provides structural support for the circuit board assembly. Moreover, the fixture includes at least one fastening mechanism extending from the first side and configured to at least one of retain and align each of the plurality of fixed circuits in position relative to each of the plurality of supporting surfaces. Further, the fixture includes at least one retainer coupled to at least one of the plurality of supporting surfaces for retaining an alignment of each of the plurality of supporting surfaces relative to each other.

In another aspect, a system for use in assembling a circuit board assembly includes a circuit board including a plurality of fixed circuits coupled together using at least one flexible circuit, wherein the plurality of fixed circuits includes at least one of a fully flexible circuit, a flexible circuit having stiffeners, and a rigid circuit, and a circuit board assembly fixture. The circuit board assembly fixture includes a plurality of supporting surfaces each including a first side and an opposite second side, wherein each first side is configured to receive at least one of the plurality of fixed circuits. Moreover, the system includes at least one hinge configured to couple the plurality of supporting surfaces together, wherein each of the at least one hinge enables the plurality of supporting surfaces to be folded into a desired alignment relative to each other and provides structural support for the circuit board assembly. Further, the system includes at least one fastening mechanism extending from the first side and configured to at least one of retain and align each of the plurality of fixed circuits in position relative to each of the plurality of supporting surfaces, and at least one retainer coupled to at least one of the plurality of supporting surfaces for retaining an alignment of each of the plurality of supporting surfaces relative to each other.

In yet another aspect, a method of assembling a circuit board assembly including a circuit board assembly fixture and a plurality of fixed circuits coupled together using at least one flexible circuit includes coupling the plurality of fixed circuits to the circuit board assembly fixture, wherein the plurality of fixed circuits includes at least one of a fully flexible circuit, a flexible circuit having stiffeners, and a rigid circuit. The fixture also includes a plurality of supporting surfaces each including a first side and an opposite second side, wherein each first side is configured to receive at least one of the plurality of fixed circuits. Moreover, the fixture includes at least one hinge configured to couple the plurality of supporting surfaces together and provide structural support for the circuit board assembly, at least one fastening mechanism extending from the first side and configured to at least one of retain and align each of the plurality of fixed circuits in position relative to each of the plurality of supporting surfaces, and at least one retainer coupled to at least one of the plurality of supporting surfaces. The method further includes folding the circuit board assembly fixture into a desired alignment such that the at least one retainer retains an alignment of each of the plurality of supporting surfaces relative to each other.

DETAILED DESCRIPTION OF THE INVENTION

As used herein, the term "circuit board" is used interchangeably with the term "circuit" and thus includes a fully flexible circuit, a flexible circuit using stiffeners, a hybrid rigid-flexible circuit, and/or a rigid circuit; any of which include one or more single layer circuits or multiple layer circuits. In addition, the term "circuit board" includes any suitable circuit known to those skilled in the art and guided by the teachings herein provided that is capable of performing the functions described herein.

Figure 1:
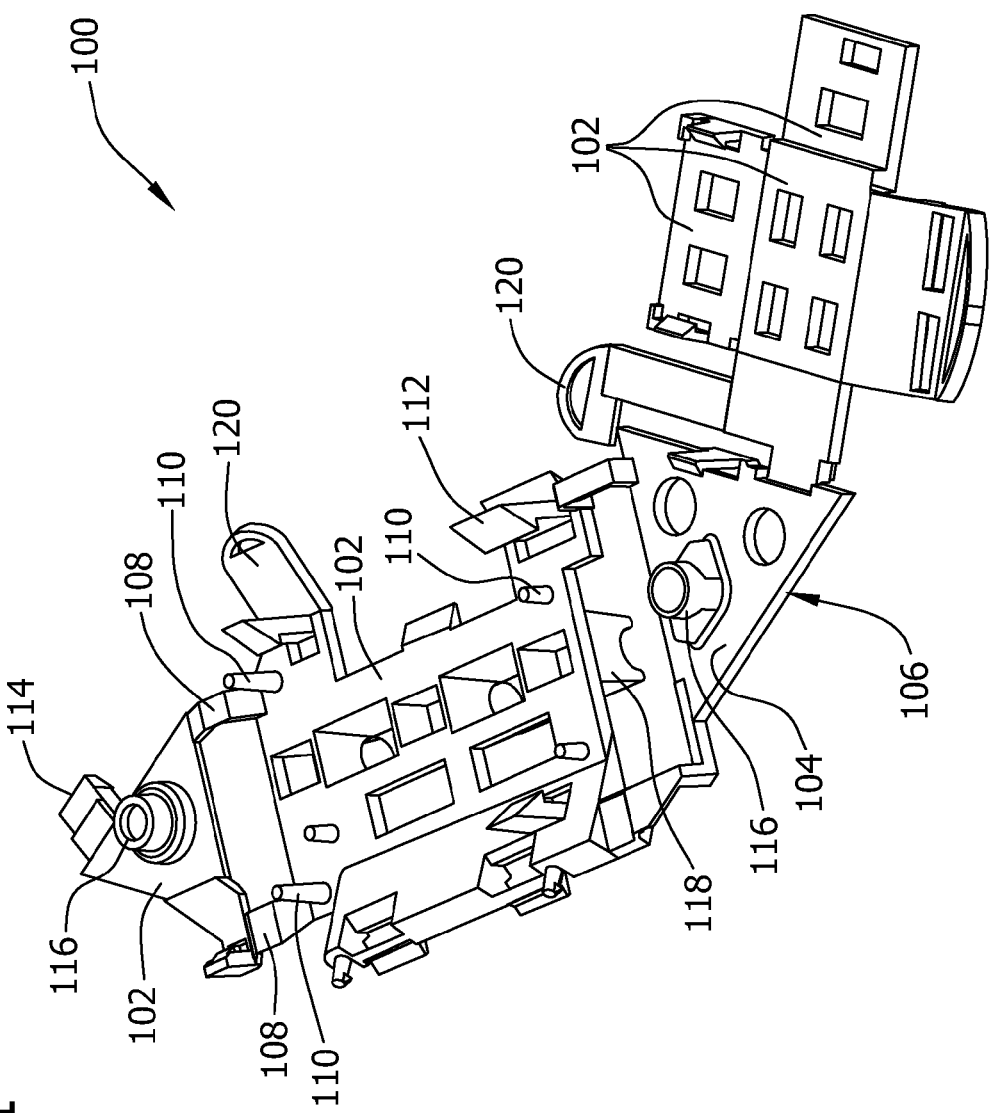
FIG. 1 is a schematic diagram of an exemplary circuit board assembly fixture for use in assembling a circuit board assembly including flexible and/or rigid circuit boards.

FIG. 1 is a schematic diagram of an exemplary circuit board assembly fixture 100 for use in assembling a circuit board assembly (not shown in FIG. 1). In the exemplary embodiment, the circuit board assembly is manufactured using known manufacturing methods and includes a plurality of fixed circuits (not shown in FIG. 1) that are coupled together using at least one flexible circuit (not shown in FIG. 1). In the exemplary embodiment, fixture 100 includes a plurality of supporting surfaces 102 that each include a first side 104 and an opposite second side 106. First side 104 receives at least one of the plurality of fixed circuits such that the plurality of fixed circuits are positioned on and coupled to first side 104. In the exemplary embodiment, fixture surfaces 102 are created using an injection molding process, and fixture surfaces 102 may be anti-static or static-dissipative to protect the circuit assembly. In other embodiments, fixture 100 may be created using any other known fabrication methods that enable surfaces 102 to function as described herein. Moreover, in the exemplary embodiment, fixture 100 includes at least one hinge 108 that is used to couple surfaces 102 together. Hinges 108 enable surfaces 102 to be folded into a desired alignment relative to each other, and provide structural support for the circuit board assembly. In the exemplary embodiment, hinge 108 is a living hinge created using an injection molding process, and is used to prescribe the bend radius or radii of the flexible circuit. Such a bend radius can insure that minimum bend radius parameters of the flexible circuit is not violated during assembly, thus reducing the risk of damage and loss of use of the circuit board assembly. In other embodiments, any other known hinges 108 that enable surfaces 102 to be folded as described herein may be used. Moreover, in the exemplary embodiment, surfaces 102 and hinge 108 are integrally formed together using an injection molding process.

In the exemplary embodiment, each fixture 100 includes at least one fastening mechanism, such as a pin 110 and/or a clasp 112 that extends from surface first side 104. Pin 110 and/or clasp 112 retain and/or align each of the plurality of fixed circuits (not shown in FIG. 1) in position relative to surfaces 102. In the exemplary embodiment, pins 110 may also be used as a standoff to position the fixed circuit a predetermined distance from surfaces 102 as to enable clasp 112 to retain the fixed circuit. In another embodiment, pins 110 are used to align the fixed circuit using alignment passages (not shown) defined through the fixed circuit. In one embodiment, fixture 100 includes four pins 110 that are each located on surfaces 102 for a respective corner of the fixed circuit. In other embodiments, fixture 100 may include any number of pins 110 that enable fixture 100 to function as described herein. In the exemplary embodiment, pins 110 and clasps 112 are formed integrally with surfaces 102. In another embodiment, pins 110 and clasps 112 are coupled to surfaces 102 after surfaces 102 have been created. In such embodiments, pins 110 and clasps 112 are coupled to surfaces 102 using any known coupling methods that enable pins 110 and clasps 112 to function as described herein. Furthermore, in the exemplary embodiment, fixture 100 includes at least one retainer 114 that is coupled to surface 102 to retain the alignment of surfaces 102 with respect to each other. In the exemplary embodiment, retainer 114 enables a user/assembler to 'lock-in' the assembled alignment of fixture 100 quickly, thus saving assembly time typically required with adhesives, such as hot glue, or from using various fasteners. In the exemplary embodiment, each retainer 114 fixedly secures the assembled alignment of fixture 100. In some embodiments, retainer 114 is lockable and unlockable to enable the alignment of fixture 100 to be changed.

In the exemplary embodiment, fixture 100 also includes at least one passage 116 extending therethrough, and a potting tube guide 118 that extends from first side 104 and/or second side 106. Moreover, in the exemplary embodiment, potting tube guide 118 positions the assembled circuit board assembly (not shown in FIG. 1) within a product housing (not shown) when a potting tube (not shown) is inserted through the assembly into potting tube guide 118. Furthermore, in the exemplary embodiment, fixture 100 includes at least one biasing mechanism 120 that is coupled to surface 102 to facilitate positioning the assembly within the product housing.

Figure 2:
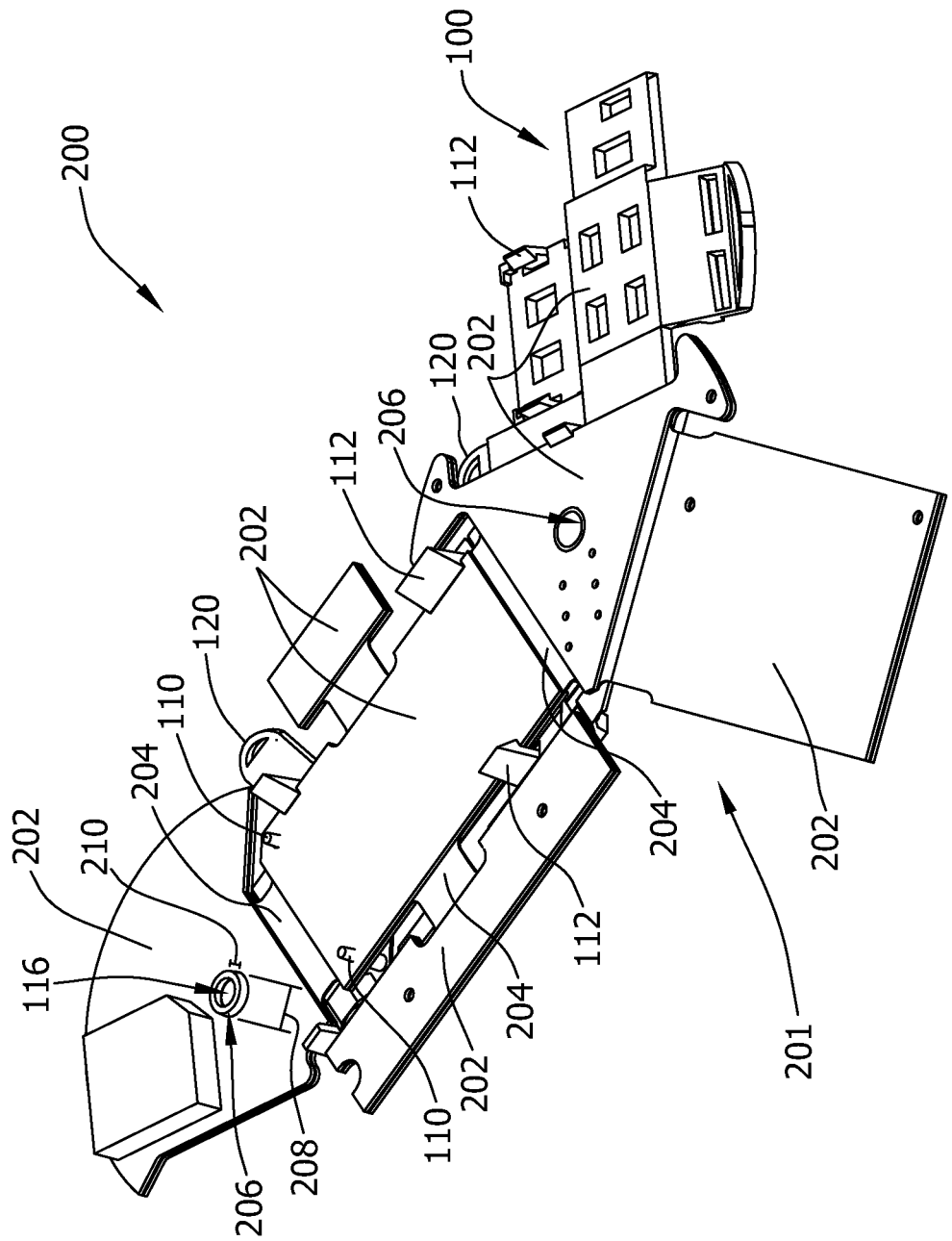
FIG. 2 is a block diagram illustrating an exemplary circuit board assembly system for use in assembling a circuit board assembly including flexible and/or rigid circuit boards.

FIG. 2 is a block diagram of an exemplary system 200 that may be used in assembling a circuit board assembly (not shown) using a circuit board assembly fixture 100. As such, components of fixture 100 illustrated in FIG. 2 are identified with the same reference numerals used in FIG. 1. In the exemplary embodiment, in addition to circuit board assembly fixture 100, system 200 includes a circuit board 201 that includes a plurality of fixed circuits 202 coupled together via at least one flexible circuit 204. Fixed circuits 202 may be fully flexible, flexible with stiffeners, or rigid circuits. In the exemplary embodiment, fixed circuits 202 are rigid circuit boards. Moreover, in the exemplary embodiment, one or more fixed circuits 202 extend across surfaces 102 and are retained and/or aligned in position relative to surface 102 by the at least one fastening mechanism such as pin 110 and/or clasp 112, such that at least one flexible circuit 204 is coupled to an adjacent fixed circuit 202. More specifically, in the exemplary embodiment, one flexible circuit 204 couples two fixed circuits 202 together. In other embodiments, any number of flexible circuits 204 can couple two fixed circuits 202 together such that system 200 functions as described herein.

Further, in the exemplary embodiment, to facilitate positioning circuit board assembly within a product housing, fixture 100 also includes at least one passage 116 defined therethrough. Moreover, in the exemplary embodiment, each fixed circuit 202 includes a corresponding passage 206 for each passage 116 defined in fixture 100 that receives fixed circuit 202. As such, a diameter 208 of each fixed circuit passage 206 is larger than an outer diameter 210 of each fixture passage 116, such that a potting tube guide (not shown) can be inserted through passage 116 and passage 206 for use in positioning the circuit board assembly within a product housing.

The exemplary circuit board assembly system 200 as described provides a novel system for assembling a circuit board generally in less time than other systems. By reducing the time for assembly, exemplary system 200 can thus decrease the overall time required to manufacture a product incorporating the circuit board assembly with a negligible cost increase for incorporating fixture 100 in such assembly.

Figure 3:
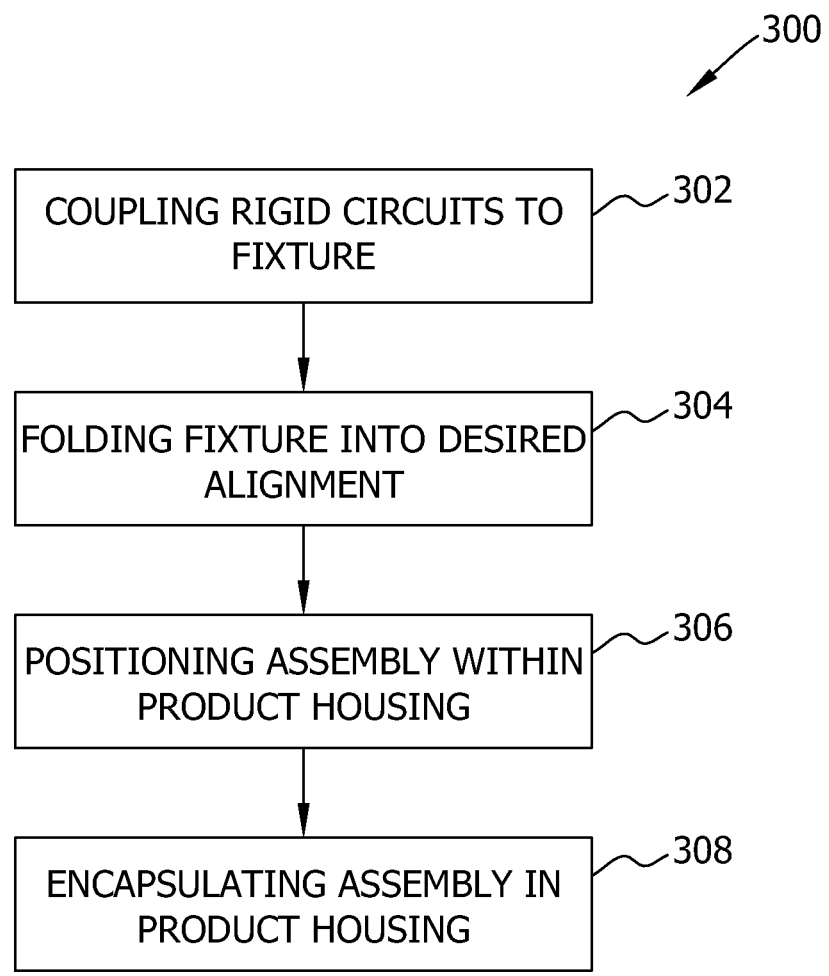
FIG. 3 is a flow chart of an exemplary method of assembling a circuit board assembly including flexible and/or rigid circuit boards.

FIG. 3 is a flow chart of an exemplary method 300 for use in assembling a circuit board assembly that includes a circuit board assembly fixture and plurality of fixed circuits coupled together using at least one flexible circuit. In the exemplary embodiment, the plurality of fixed circuits are initially coupled 302 to the circuit board assembly fixture. Moreover, in the exemplary embodiment, the circuit board assembly fixture is then folded 304 into a desired alignment, wherein at least one retainer retains an alignment of each of the board surfaces relative to each other. The plurality of fixed circuits are coupled 302 to the board surfaces that had been previously formed using an injection molding process.

The circuit board assembly is then positioned 306 within a product housing, and the assembly is then encapsulated 308 within the product housing. In one embodiment, the circuit board assembly is a standalone assembly that is used outside of the product housing. In another embodiment, a non-encapsulated circuit board assembly is used within the product housing. In another embodiment, to facilitate proper positioning within the product housing, the circuit board assembly fixture includes passages extending therethrough. A potting tube guide extending from a first side and/or a second side of the surfaces receives the fixed circuits and flexible circuits therein, such that a potting tube can be inserted through the assembly to facilitate proper positioning. Moreover, the potting tube guide may enable encapsulation of the circuit board assembly within the product housing while reducing voids, or pockets of air, within the encapsulation material.

Assembling a circuit board assembly using the methods described here facilitates reducing an amount of time used to manufacture a product that includes the circuit board assembly. Moreover, in the exemplary embodiment, by coupling rigid fixed circuits to the fixture surfaces prior to folding the hybrid rigid-flex circuit board along the flexible circuits, the exemplary method facilitates reducing potential failures caused by accidental creasing of the flexible circuits. Further, although coupling a fixture to a circuit board may increase material costs during manufacture, the decrease in both production time and production errors can lead to increased production capacity and efficiency, thus overall costs per unit can be reduced.

Although the exemplary apparatus, system, and methods described herein are described in the context of using a fixture for assembling a hybrid rigid-flex circuit board, it should be understood that the apparatus, system, and methods are not limited to use with only a hybrid rigid flexible circuit board. For example, the fixture described herein can be used with a plurality of flexible circuits, such as flexible circuits with stiffeners that can be coupled together using other than flexible circuits, such as known cabling using known attachment methods. As such, those skilled in the art will recognize that the claims and described embodiments can be practiced with modification within the spirit and scope of the claims.

Although specific features of various embodiments of the invention may be shown in some drawings and not in others, this is for convenience only. Moreover, references to "one embodiment" in the above description are not intended to be interpreted as excluding the existence of additional embodiments that also incorporate the recited features. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of assembling a circuit board assembly operatively associated with a circuit board assembly fixture and a plurality of fixed circuits coupled together using at least one flexible circuit, said method comprising:
   coupling the plurality of fixed circuits to the circuit board assembly fixture, wherein the plurality of fixed circuits comprises at least one of a fully flexible circuit, a flexible circuit having stiffeners, and a rigid circuit, and wherein the circuit board assembly fixture comprises:
   a plurality of supporting surfaces each comprising a first side and an opposite second side, each first side is configured to receive at least one of the plurality of fixed circuits;
   at least one hinge configured to couple the plurality of supporting surfaces together and provide structural support for the circuit board assembly;
   at least one fastening mechanism extending from the first side and configured to at least one of retain and align each of the plurality of fixed circuits in position relative to each of the plurality of supporting surfaces; and
   at least one retainer coupled to at least one of the plurality of supporting surfaces; and
   folding the circuit board assembly fixture into a desired alignment such that the at least one retainer retains an alignment of each of the plurality of supporting surfaces relative to each other.

2. The method in accordance with claim 1 further comprising coupling the plurality of fixed circuits to the circuit board assembly fixture wherein each of the plurality of supporting surfaces of the fixture comprises a molded plastic surface.

3. The method in accordance with claim 1 further comprising coupling the plurality of fixed circuits to the circuit board assembly fixture wherein the at least one hinge comprises a molded plastic living hinge.

4. The method in accordance with claim 3 further comprising coupling the plurality of fixed circuits to the circuit board assembly fixture, wherein the living hinge is formed integrally with the plurality of supporting surfaces, and the living hinge comprises molded plastic.

5. The method in accordance with claim 1 further comprising coupling the plurality of fixed circuits to the circuit board assembly fixture, wherein the fixture further comprises at least one passage extending therethrough and a potting tube guide extending from one of the first side and the second side of the supporting surface, and the at least one passage and the potting tube guide each positions the circuit board assembly within a product housing.

6. The method in accordance with claim 1 further comprising coupling the plurality of fixed circuits to the circuit board assembly fixture, wherein the fixture further comprises at least one biasing mechanism coupled to at least one of the plurality of supporting surfaces, and the biasing mechanism facilitates positioning the circuit board assembly within a product housing.

7. The method in accordance with claim 1 further comprising positioning the circuit board assembly within a product housing.

8. The method in accordance with claim 7 further comprising chemically encapsulating the circuit board assembly within the product housing.

* * * * *